United States Patent
Kim

(10) Patent No.: US 7,642,190 B2
(45) Date of Patent: Jan. 5, 2010

(54) METHOD OF FORMING THIN INSULATING LAYER IN MRAM DEVICE

(75) Inventor: Hyo Sang Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 391 days.

(21) Appl. No.: 11/616,800

(22) Filed: Dec. 27, 2006

(65) Prior Publication Data
US 2007/0148977 A1      Jun. 28, 2007

(30) Foreign Application Priority Data
Dec. 28, 2005   (KR) ...................... 10-2005-0132086

(51) Int. Cl.
*H01L 21/302* (2006.01)
(52) U.S. Cl. .................. 438/691; 438/706; 438/745; 438/692; 438/E21.548
(58) Field of Classification Search .......... 438/475–750
See application file for complete search history.

(56) References Cited

U.S. PATENT DOCUMENTS

| 6,261,957 | B1 * | 7/2001 | Jang et al. ................ 438/692 |
| 6,271,124 | B1 * | 8/2001 | Choi et al. ................ 438/633 |
| 7,098,116 | B2 * | 8/2006 | Lu et al. .................. 438/427 |

* cited by examiner

*Primary Examiner*—Dung A. Le
(74) *Attorney, Agent, or Firm*—Sherr & Vaughn, PLLC

(57) ABSTRACT

A method of forming a thin insulating layer in an MRAM device makes it possible to effectively prevent the insulating layer from being locally thinned, creating a short circuit or other defect. The method includes forming lower patterns for the MRAM device on a semiconductor substrate. An insulating layer for covering the lower patterns is formed. Portions of the insulating layer which are substantially thicker relative to other portions of the insulating layer are selectively dry etched using a photoresist mask. The insulating layer is planarized a chemical mechanical polishing (CMP) process so that the insulating layer remains at a thickness larger than a target thickness. The surface of the planarized insulating layer is plasma dry etched or wet etched such that the insulating layer is reduced to the target thickness.

12 Claims, 11 Drawing Sheets

METHOD OF FORMING THIN INSULATING LAYER IN MRAM DEVICE

The present application claims priority under 35 U.S.C. 119 and 35 U.S.C. 365 to Korean Patent Application No. 10-2005-0132086 (filed on Dec. 28, 2005), which is hereby incorporated by reference in its entirety.

BACKGROUND

An MRAM device is a memory device having a memory unit for storing information using a magnetic effect such as tunneling magneto resistance. When forming the MRAM device, a thin insulating layer having a thickness of about 1000 nm is necessary to insulate a top electrode contact (TEC) for connecting an information storage memory unit and an upper electrode to each other.

FIG. 1 schematically illustrates a related MRAM device.

Referring to FIG. 1, the related MRAM includes transistor devices 15 formed on a semiconductor substrate 10. The semiconductor substrate 10 and the transistor devices 15 are insulated from each other by a lower insulating layer 20. Connection contact structures 30 that penetrate the lower insulating layer 20 are provided in the related MRAM. Also, first metal layers 35 are also provided in the related MRAM. The first metal layers can be electrically connected to the connection contact structures 30. Second metal layers 40 are included on the first metal layers 35. Data lines 45 are used together with the patterns of the second metal layers 40.

The patterns of the second metal layers 40 are electrically connected to the transistor devices 15 by the connection contact structures 30. Lower electrodes 50 are formed on the second metal layers 40. Although not shown, on the lower electrodes 50, an information storage memory unit using a device characteristic is included. An upper electrode 70 including a TiN layer 71 and a third metal layer 75 is formed on the information storage memory unit.

A thin insulating layer 60 made of silicon oxide is formed between the upper electrode 70 and the lower electrode 50 with a thickness between 1,000 to 1,500 nm. The thin insulating layer 60 is used for insulating the top electrode contact (TEC).

FIGS. 2 and 3 schematically illustrate a method of forming a thin insulating layer in a conventional MRAM device.

Referring to FIG. 2, after forming lower patterns 80 such as the lower electrodes and the information storage memory, a first insulating layer 91 can be formed that fills the gaps of the lower patterns 80. The lower patterns 80 include integrated narrow patterns and wide patterns, and the first insulating layer 91 has very low planarization characteristics. In order to planarize the first insulating layer 91, a second insulating layer 93 having better planarization characteristics is formed on the first insulating layer 91. However, the thickness of the entire insulating layer 90 including the first insulating layer 91 and the second insulating layer 93 still vary by region.

A CMP process is performed on the insulating layer 90. Therefore, the insulating layer 90 illustrated in FIG. 3 is planarized. However, in the planarization process, complete local or entire planarization cannot be actually performed. Therefore, when the insulating layer 90 is polished so as to realize a target thickness, the insulating layer becomes severely thin creating an electric short or other defects.

FIGS. 4 and 5 are photographs illustrating the problems with the method of forming thin insulating layer in the related MRAM device.

FIG. 4 is a photograph illustrating the insulating layer having a target thickness and FIG. 5 is a photograph illustrating the insulating layer having a locally thin region, causing a short. As illustrated in FIGS. 4 and 5, according to the related method of forming the thin insulating layer, the insulating layer develops a locally thin region so that the insulating layer cannot be sufficiently insulated from the subsequent metal layers, creating an electrical short or other defect.

SUMMARY

Embodiments relate to a method of forming a thin insulating layer having uniform thickness in an MRAM device. The method includes forming lower patterns for the MRAM device on a semiconductor substrate. An insulating layer for covering the lower patterns is formed. Portions of the insulating layer which are substantially thicker relative to other portions of the insulating layer are selectively dry etched using a photoresist mask. The insulating layer is planarized a chemical mechanical polishing (CMP) process so that the insulating layer remains at a thickness larger than a target thickness. The surface of the planarized insulating layer is plasma dry etched or wet etched such that the insulating layer is reduced to the target thickness.

The selectively dry etched portions lie over lower pattern features having a width of 50 μm or more.

DETAILED DESCRIPTION

Figure 1:
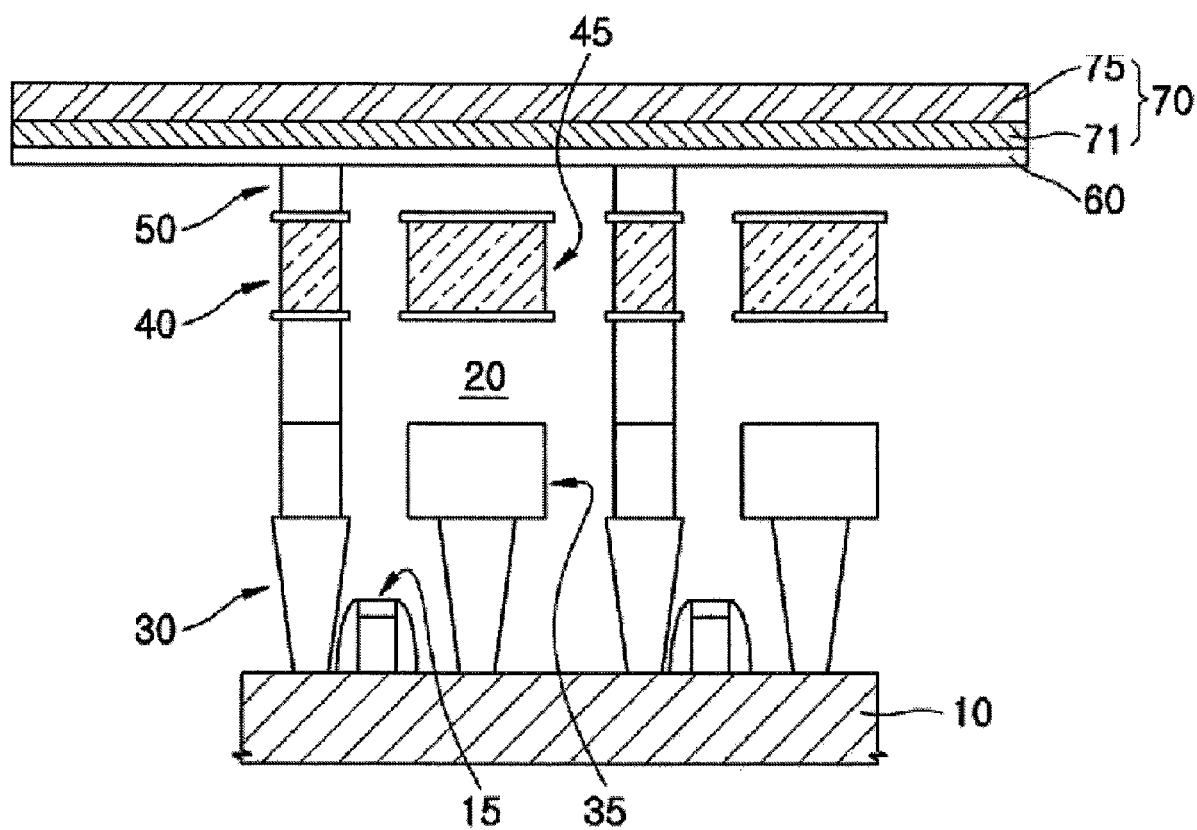
FIG. 1 schematically illustrates a related MRAM device.
Figure 2:
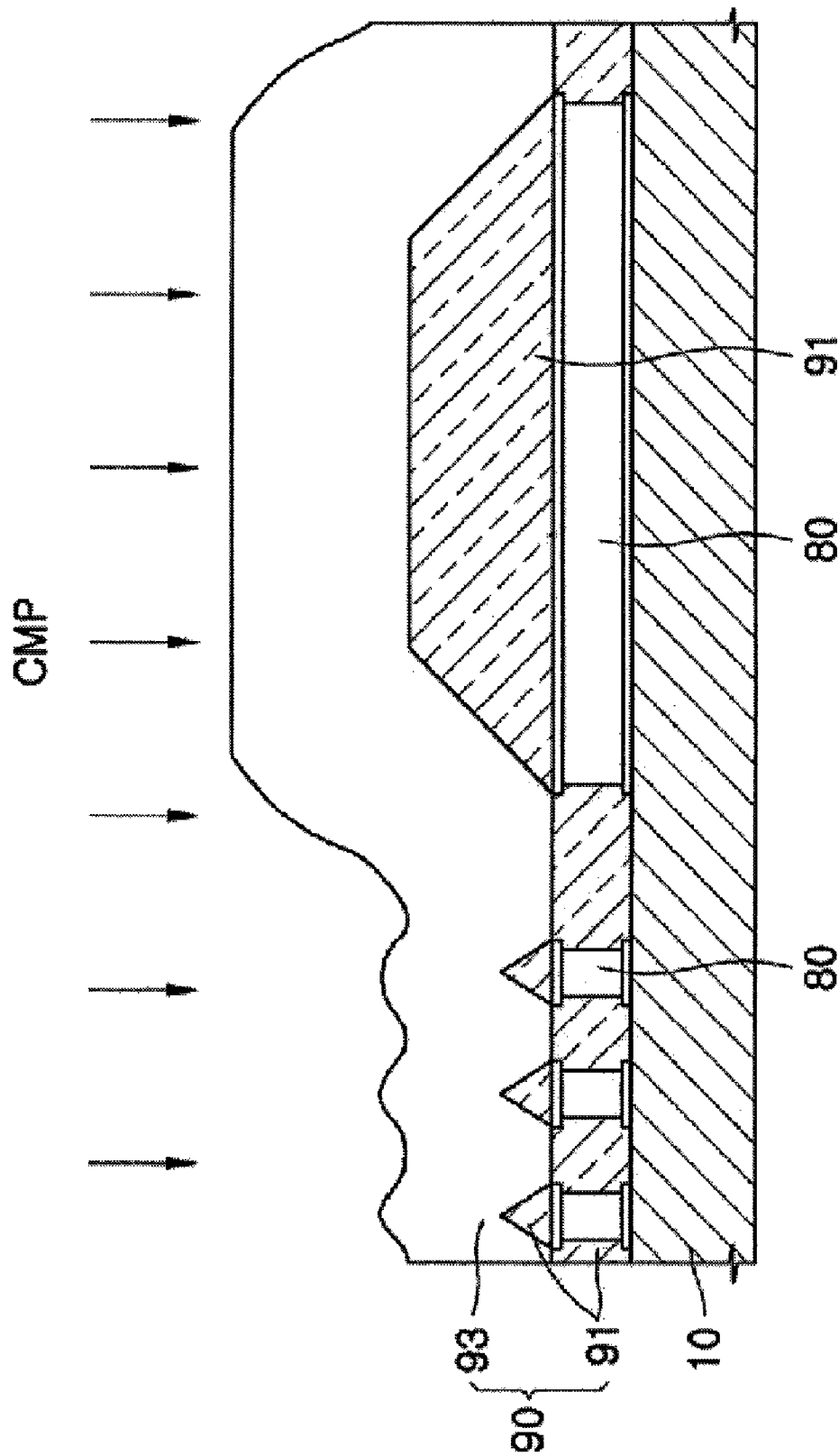
FIGS. 2 and 3 are sectional views schematically illustrating a method of forming a thin insulating layer in a related MRAM device.
Figure 3:
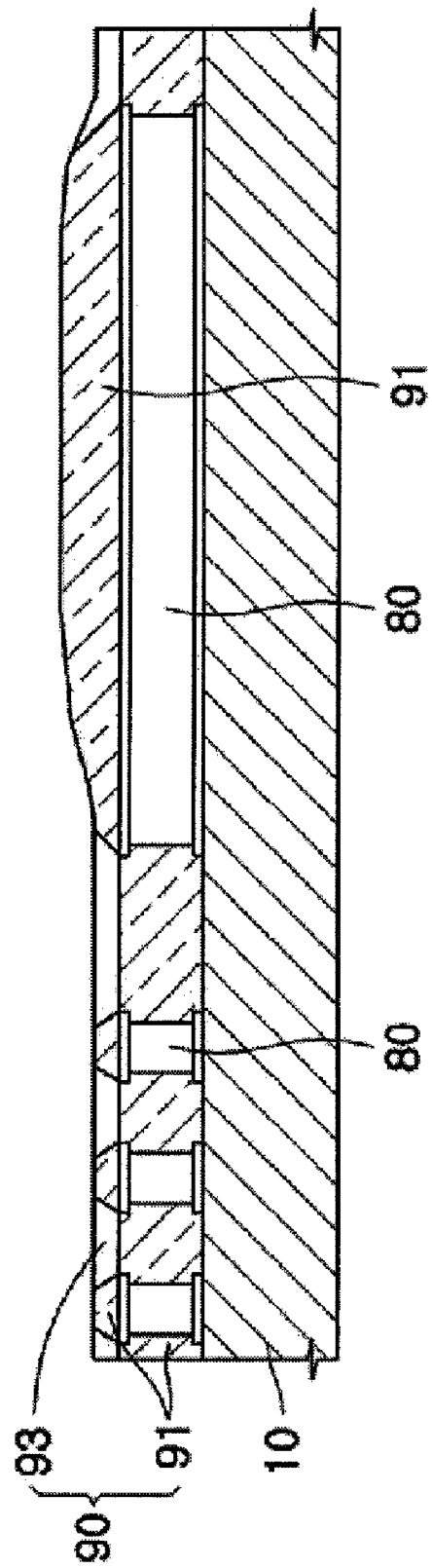
Figure 4:
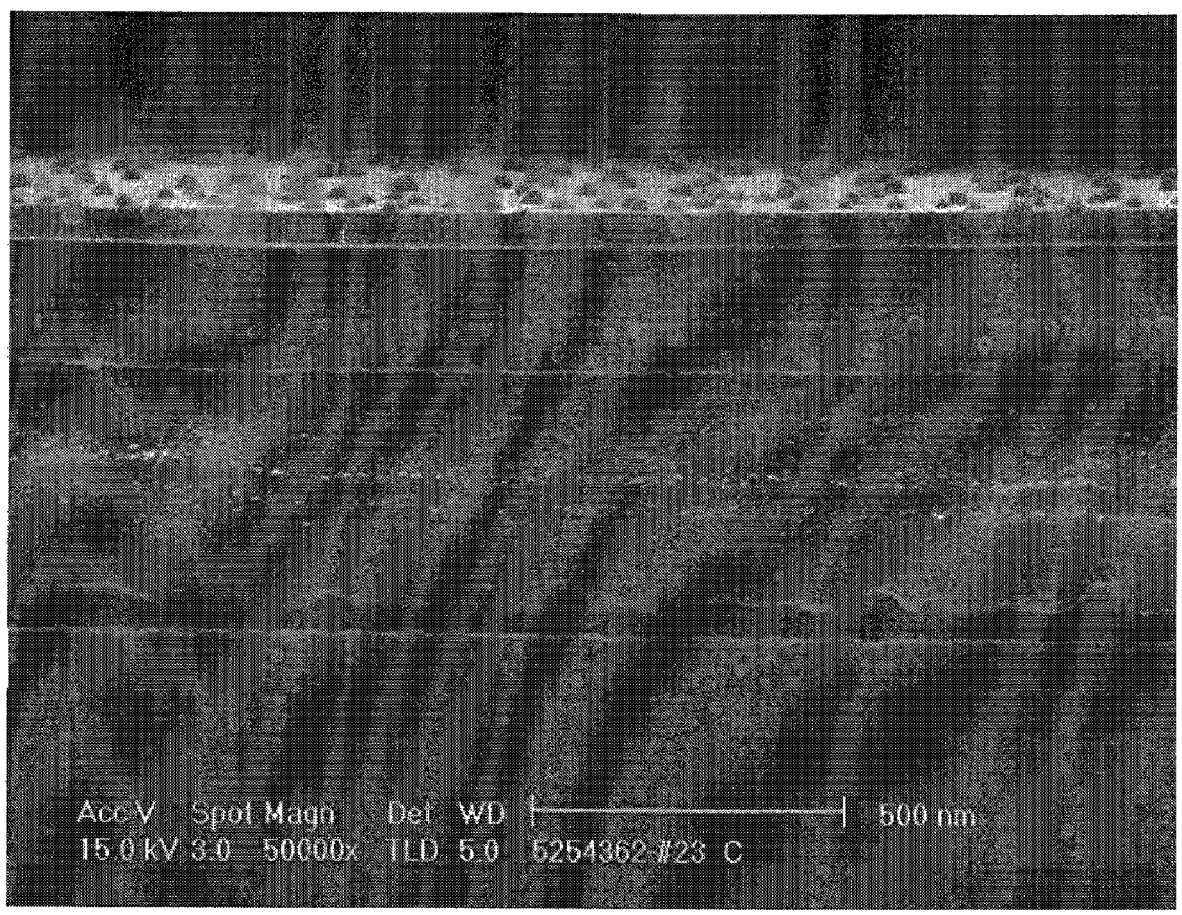
FIGS. 4 and 5 are photographs illustrating problems of the method of forming the thin insulating layer in the related MRAM device; and Example
Figure 5:
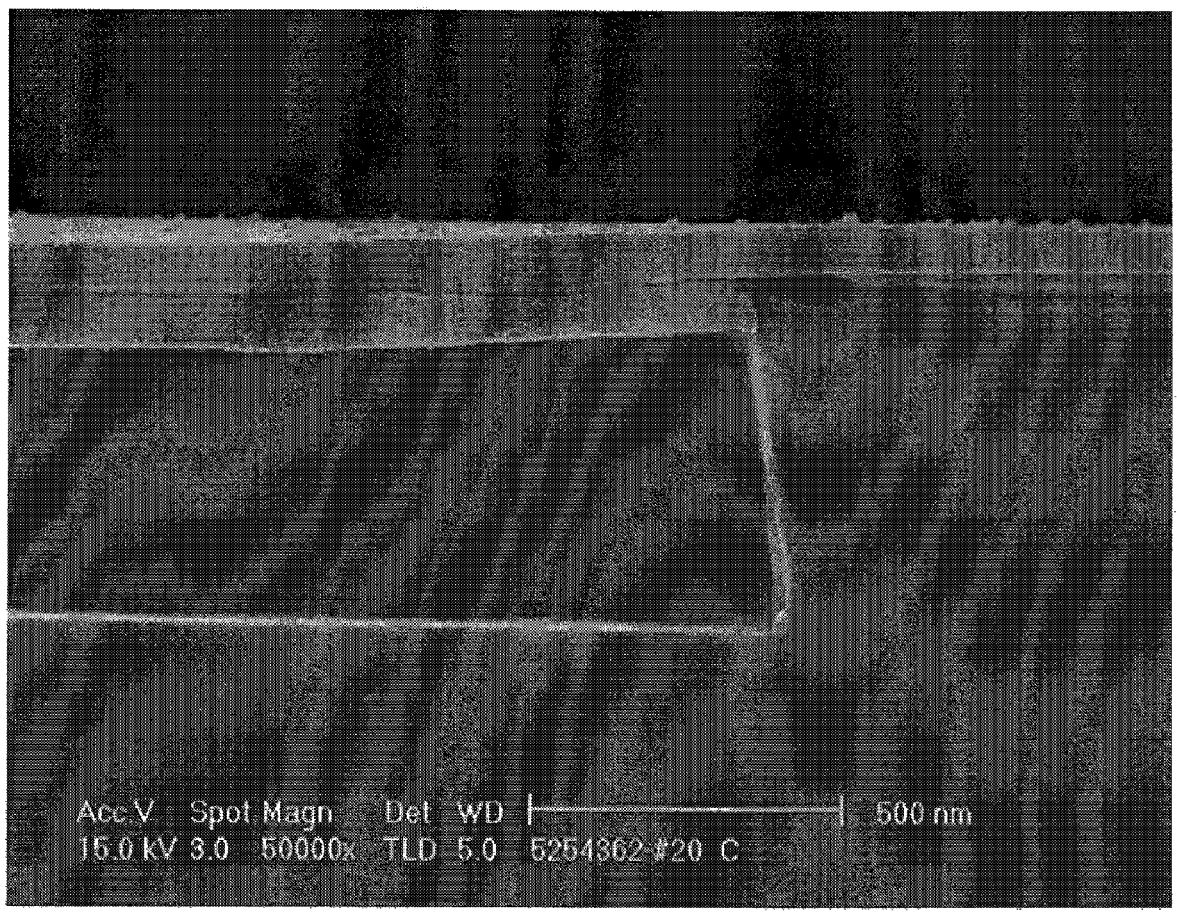
Figure 6:
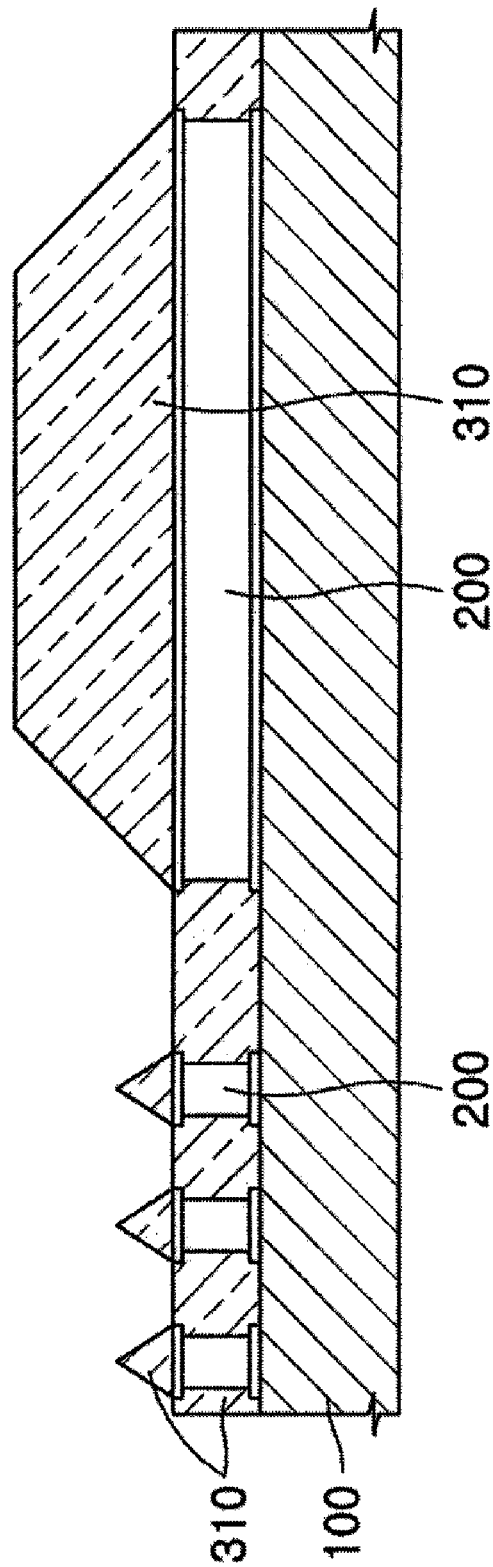
FIGS. 6 to 11 are sectional views schematically illustrating a method of forming a thin insulating layer in an MRAM device according to embodiments.

Referring to FIG. 6, lower patterns 200 including, for example, lower electrodes and an information storage memory unit for an MRAM device are formed over a semiconductor substrate 100. Although not shown, semiconductor substrate 100 may include various interconnections, connection contact structures, and transistor structures for the MRAM device.

The lower patterns 200 include integrated narrow patterns and wide patterns. To fill narrow gaps in the lower patterns 200, a first insulating layer 310 having excellent gap filling characteristics is deposited. When the lower patterns 200 include metal layers, a wide feature may have a width of at least about 50 μm. Because of the dearth of gaps across this relatively wide feature, the first insulating layer 310 formed over the feature is much thicker than in other areas.

Figure 7:
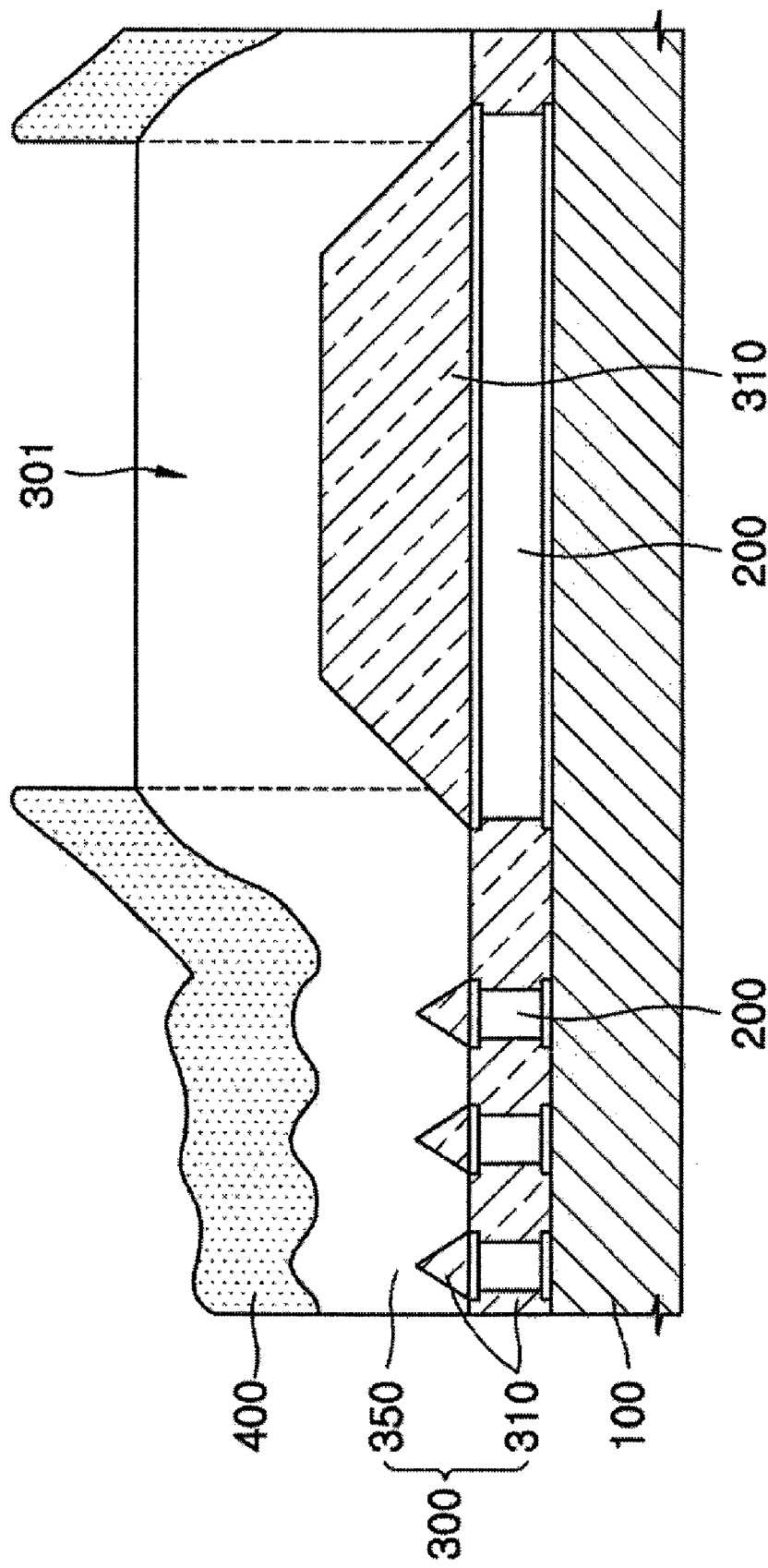

Referring to FIG. 7, a second insulating layer 350 having good planarization characteristics is formed on the first insulating layer 310. However, the entire insulating layer 300 including the first insulating layer 310 and the second insulating layer 350 is still substantially thicker over the 50 μm plus features.

A photoresist pattern 400 that exposes thicker portions 301 is formed on the insulating layer 300. The photoresist pattern 400 is used as an etching mask.

Figure 8:
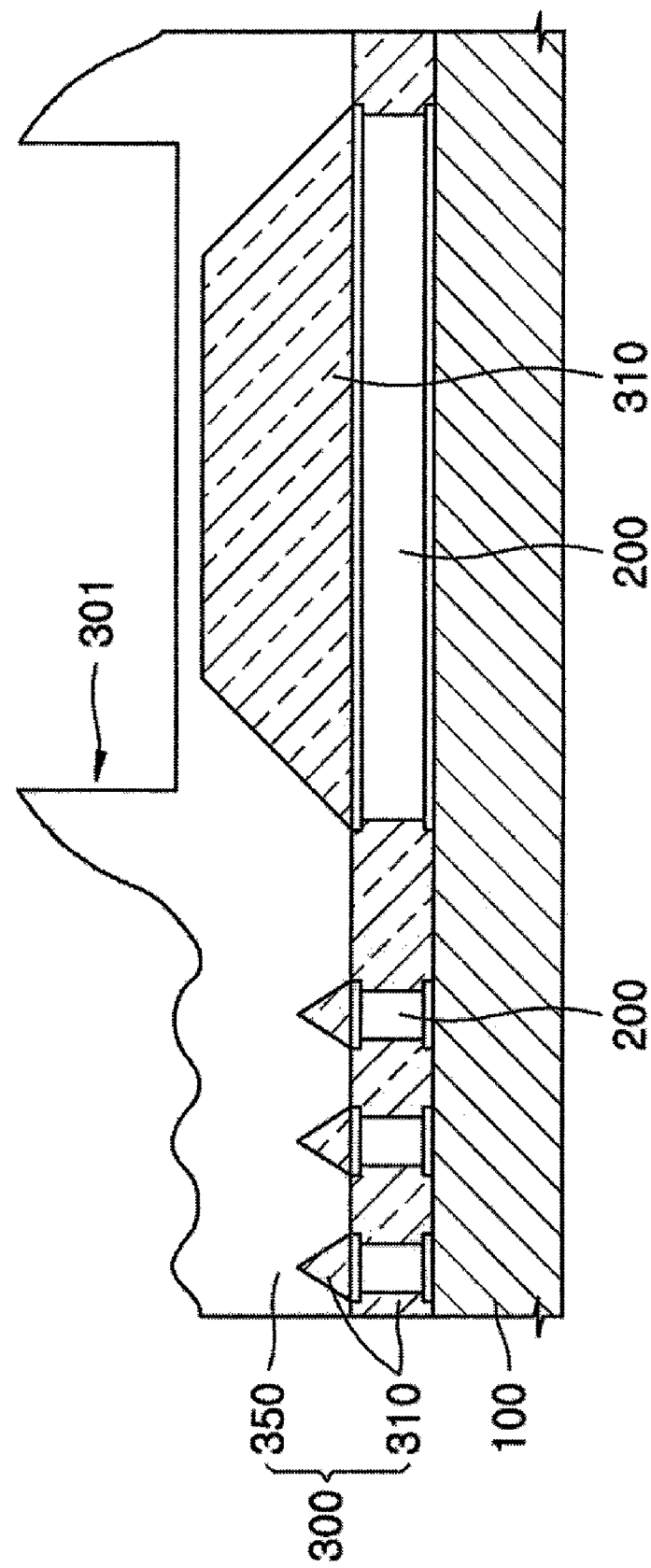

Referring to FIG. 8, the expose thicker portion 301 of the insulating layer 300 is partially etched using the photoresist pattern 400 as the etching mask. The thicker portion 301 is partially etched to have a thickness similar to the thickness of the other areas. The partial etching can be performed by dry etching.

Figure 9:
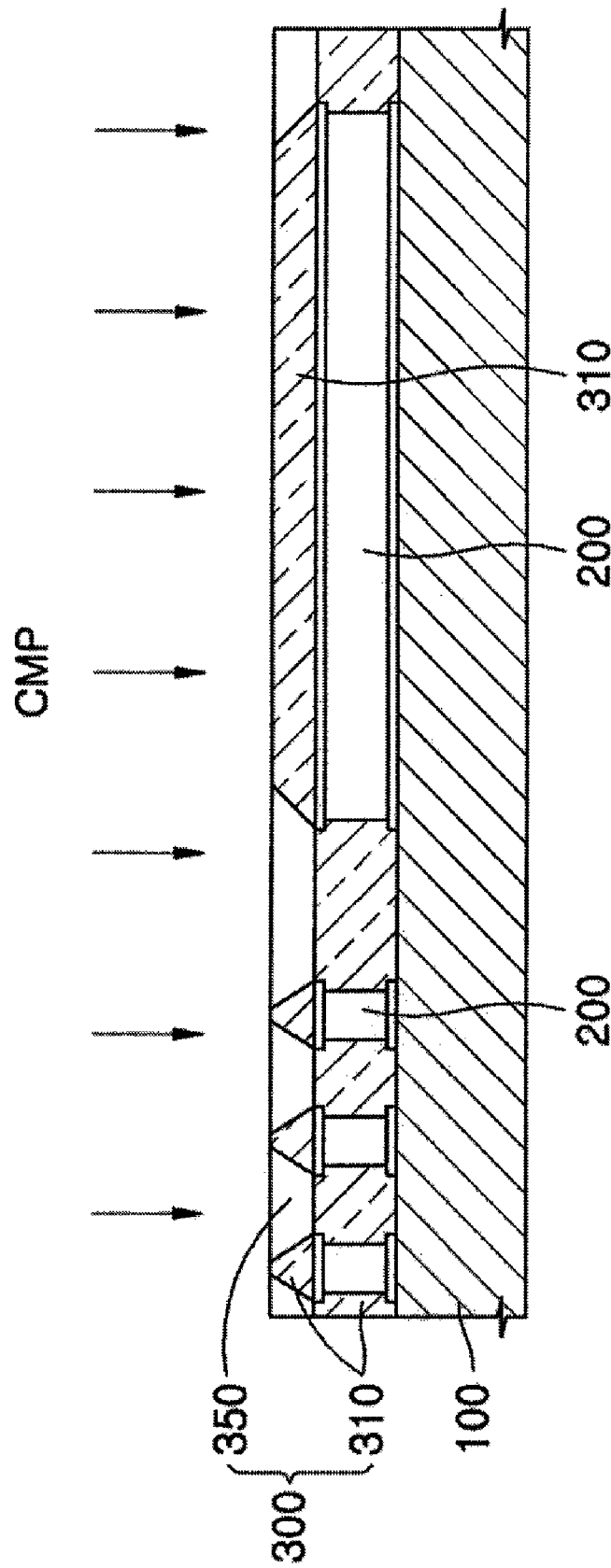

Referring to FIG. 9, the entire surface of the partially etched insulating layer 300 is planarized by a CMP process. The thickness of the resulting insulating layer is twice to three times a target thickness. That is, a partial CMP process is performed. This is to prevent the edges or the center from being excessively thinned due to increases in non-uniformity generated during the CMP process.

Figure 10:
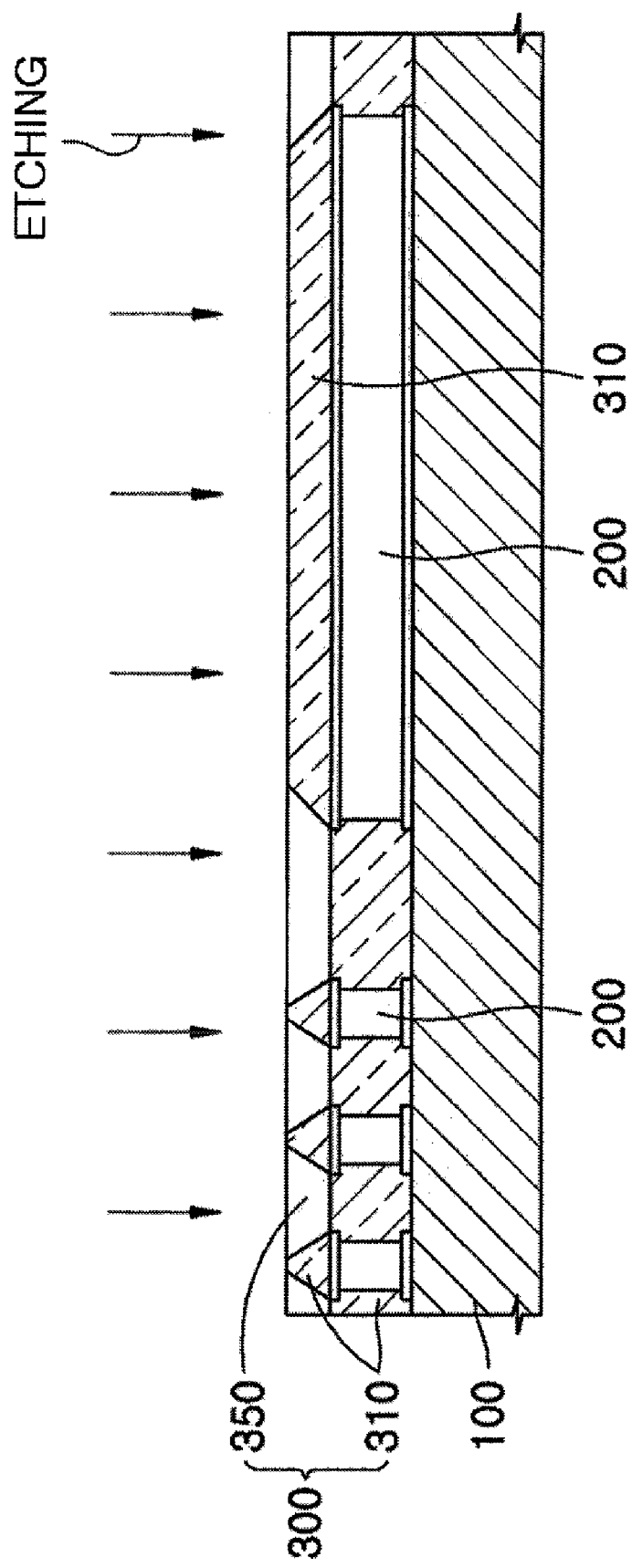

Referring to FIG. 10, the surface of the insulating layer 300 is plasma etched or wet etched to the target thickness. For example, a target thickness of the insulating layer 300 may be about 1,500 nm. The thickness of the partially CMP processed insulating layer 300 may be about 3,000 nm. Therefore, about 1,500 nm should be etched by the plasma dry etching or the wet etching. Since the insulating layer 300 is planarized by the partial CMP process, the plasma etching or the wet etching prevents the insulating layer 300 from being locally severely thinned. It is therefore possible to bring the insulating layer 300 to the target thickness.

Figure 11:
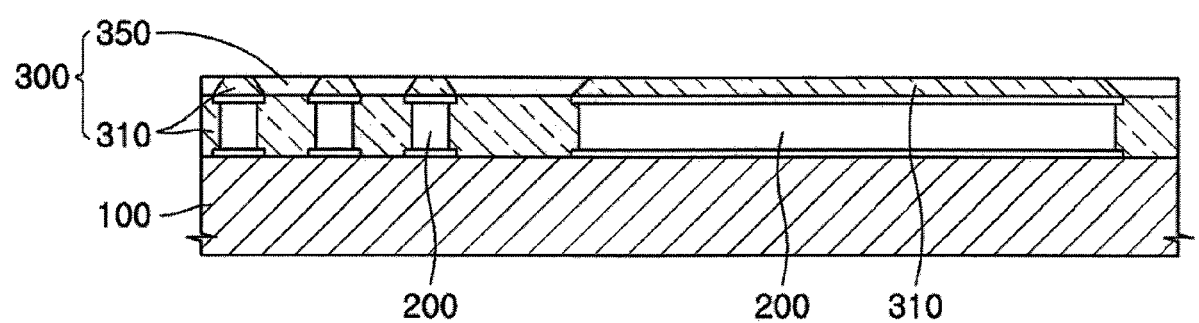

Referring to FIG. 11, it is possible to make the thickness of the insulating layer 300 about 1,500 nm by plasma dry etching or the wet etching. Thus, it is possible to effectively prevent the insulating layer 300 from being locally thinned to create a short circuit or other defect.

As described above, according to embodiments, it is possible to effectively prevent an insulating layer from being locally thinned excessively when forming the insulating layer.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of forming a thin insulating layer in an MRAM device, the method comprising:
    forming lower patterns for the MRAM device on a semiconductor substrate;
    forming an insulating layer for covering the lower patterns;
    planarizing the insulating layer so that the insulating layer remains at a thickness larger than a target thickness; and
    etching a surface of the planarized insulating layer such that the insulating layer is reduced to the target thickness.

2. The method of claim 1, further comprising before said planarizing the insulating layer:
    selectively dry etching portions of the insulating layer which are substantially thicker relative to other portions of the insulating layer.

3. The method of claim 2, wherein the selectively dry etched portions lie over lower pattern features having a width of 50 µm or more.

4. The method of claim 1, wherein said etching a surface of the planarized insulating layer comprises performing plasma dry etching relative to the surface of the insulating layer.

5. The method of claim 1, wherein said etching a surface of the planarized insulating layer comprises performing wet etching relative to the surface of the insulating layer.

6. The method of claim 1, wherein said planarizing the insulating layer comprises performing a chemical mechanical polishing (CMP) process on the insulating layer.

7. A method of forming a thin insulating layer comprising:
    forming lower patterns comprising circuit elements on a semiconductor substrate;
    forming an insulating layer covering the lower patterns;
    selectively dry etching portions of the insulating layer which are substantially thicker than other portions of the insulating layer;
    planarizing the insulating layer such that the insulating layer remains at a thickness larger than a target thickness; and
    etching a surface of the planarized insulating layer such that the insulating layer is reduced to the target thickness.

8. The method of claim 7, wherein the selectively dry etched portions lie over lower pattern features having a width of 50 µm or more.

9. The method of claim 7, wherein said selectively dry etching portions of the insulating layer comprises using a photoresist mask pattern.

10. The method of claim 7, wherein said etching a surface of the planarized insulating layer comprises performing plasma dry etching relative to the surface of the insulating layer.

11. The method of claim 7, wherein said etching a surface of the planarized insulating layer comprises performing wet etching relative to the surface of the insulating layer.

12. The method of claim 7, wherein said planarizing the insulating layer comprises performing a chemical mechanical polishing (CMP) process on the insulating layer.

* * * * *